(12) United States Patent
Dasgupta et al.

(10) Patent No.: US 10,658,502 B2
(45) Date of Patent: May 19, 2020

(54) VERTICAL III-N TRANSISTORS WITH LATERAL OVERGROWTH OVER A PROTRUDING III-N SEMICONDUCTOR STRUCTURE

(71) Applicant: Intel Corporation, Santa Clara, CA (US)

(72) Inventors: Sansaptak Dasgupta, Hillsboro, OR (US); Han Wui Then, Portland, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/773,422

(22) PCT Filed: Dec. 24, 2015

(86) PCT No.: PCT/US2015/000422
§ 371 (c)(1),
(2) Date: May 3, 2018

(87) PCT Pub. No.: WO2017/111852
PCT Pub. Date: Jun. 29, 2017

(65) Prior Publication Data
US 2018/0323298 A1    Nov. 8, 2018

(51) Int. Cl.
*H01L 29/778*    (2006.01)
*H01L 29/08*    (2006.01)
(Continued)

(52) U.S. Cl.
CPC ...... *H01L 29/7788* (2013.01); *H01L 21/0254* (2013.01); *H01L 21/02433* (2013.01);
(Continued)

(58) Field of Classification Search
CPC ......... H01L 29/66204; H01L 29/66462; H01L 29/7788; H01L 29/861; H01L 29/0646;
(Continued)

(56) References Cited

U.S. PATENT DOCUMENTS

2003/0151110 A1* 8/2003 Disney ............... H01L 29/0886
257/502
2012/0319127 A1   12/2012 Chowdhury et al.
(Continued)

FOREIGN PATENT DOCUMENTS

WO    WO-2015175915 A1 * 11/2015    ....... H01L 29/41766

OTHER PUBLICATIONS

International Search Report & Written Opinion dated Sep. 22, 2016 for PCT Patent Application No. PCT/US15/00422.
(Continued)

*Primary Examiner* — Ermias T Woldegeorgis
(74) *Attorney, Agent, or Firm* — Green, Howard & Mughal LLP

(57) ABSTRACT

III-N transistor including a vertically-oriented lightly-doped III-N drift region between an overlying III-N 2DEG channel and an underlying heavily-doped III-N drain. In some embodiments, the III-N transistors are disposed over a silicon substrate. In some embodiments, lateral epitaxial overgrowth is employed to form III-N islands self-aligned with the vertically-oriented drift region. A gate electrode disposed over a portion of a III-N island may modulate a 2DEG within a channel region of the III-N island disposed above the III-N drift region. Charge carriers in the 2DEG channel may be swept into the drift region toward the drain. Topside contacts to each of the gate, source, and drain may be pitch scaled independently of a length of the drift region.

20 Claims, 10 Drawing Sheets

(51) Int. Cl.
*H01L 29/20* (2006.01)
*H01L 29/78* (2006.01)
*H01L 29/06* (2006.01)
*H01L 21/02* (2006.01)
*H01L 29/423* (2006.01)
*H01L 29/66* (2006.01)

(52) U.S. Cl.
CPC .. *H01L 21/02458* (2013.01); *H01L 21/02639* (2013.01); *H01L 21/02647* (2013.01); *H01L 29/0649* (2013.01); *H01L 29/0657* (2013.01); *H01L 29/0843* (2013.01); *H01L 29/2003* (2013.01); *H01L 29/42316* (2013.01); *H01L 29/66462* (2013.01); *H01L 29/78* (2013.01)

(58) Field of Classification Search
CPC . H01L 29/2003; H01L 29/201; H01L 29/205; H01L 29/7787; H01L 29/41766
See application file for complete search history.

(56) References Cited

U.S. PATENT DOCUMENTS

| | | |
|---|---|---|
| 2015/0021664 A1 | 1/2015 | Simin et al. |
| 2015/0060876 A1 | 3/2015 | Xing et al. |
| 2015/0175915 A1 | 6/2015 | Karmakar et al. |
| 2015/0319127 A1* | 11/2015 | Allen ..................... H04L 51/36 709/206 |

OTHER PUBLICATIONS

International Preliminary Report on Patentability from PCT/US2015/000422 dated Jul. 5, 2018, 9 pgs.

* cited by examiner

US 10,658,502 B2

VERTICAL III-N TRANSISTORS WITH LATERAL OVERGROWTH OVER A PROTRUDING III-N SEMICONDUCTOR STRUCTURE

CLAIM OF PRIORITY

This Application is a National Stage Entry of, and claims priority to, PCT Application No. PCT/US15/00422, filed on 24 Dec. 2015 and titled "VERTICAL III-N TRANSISTORS WITH LATERAL EPITAXIAL OVERGROWTH", which is incorporated by reference in its entirety for all purposes.

BACKGROUND

Demand for integrated circuits (ICs) in portable electronic applications has motivated greater levels of semiconductor device integration. Many advanced semiconductor devices in development leverage non-silicon semiconductor materials, some of which offer the potential of high breakdown voltages. The group III-nitride (III-N) material system shows particular promise for high voltage and high frequency applications like power management ICs and RF power amplifiers.

GaN transistors fabricated on Si substrates designed for a high breakdown voltage have conventionally had lateral device architectures. A conventional lateral GaN power transistor 101 is illustrated in FIG. 1, for example. Transistor 101 includes a GaN layer 110 disposed over a (111) surface of a silicon substrate 105. GaN layer 110 is typically 2-5 μm thick. A polarization layer 120 is grown over GaN layer 110 forming a two-degree electron gas (2DEG) 111 spanning a lateral spacing $L_1$ between gate electrode 130, source electrode 140, and drain electrode 150. For high breakdown voltage (e.g., >100V) applications, lateral gate-drain pitch $L_1$ may be over 5 μm. Such a large lateral dimension is often necessitated by poor passivation of the III-N surface by the overlying dielectric layer 180, which can lead to premature breakdown in the presence of electric fields that increase in strength with decreasing $L_1$. With the lateral gate-drain pitch $L_1$ then unable to shrink for a given breakdown voltage specification, opportunities for scaling the source-drain pitch $L_2$ are limited in such devices.

III-N power transistor architectures that enable smaller source-drain pitch for a given minimum breakdown voltage, and are scalable would be advantageous for both discrete III-N power devices and SoC applications (e.g., power management ICs and RF power amplifiers) where III-N power transistors are integrated with other devices, such as silicon-based logic transistors.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
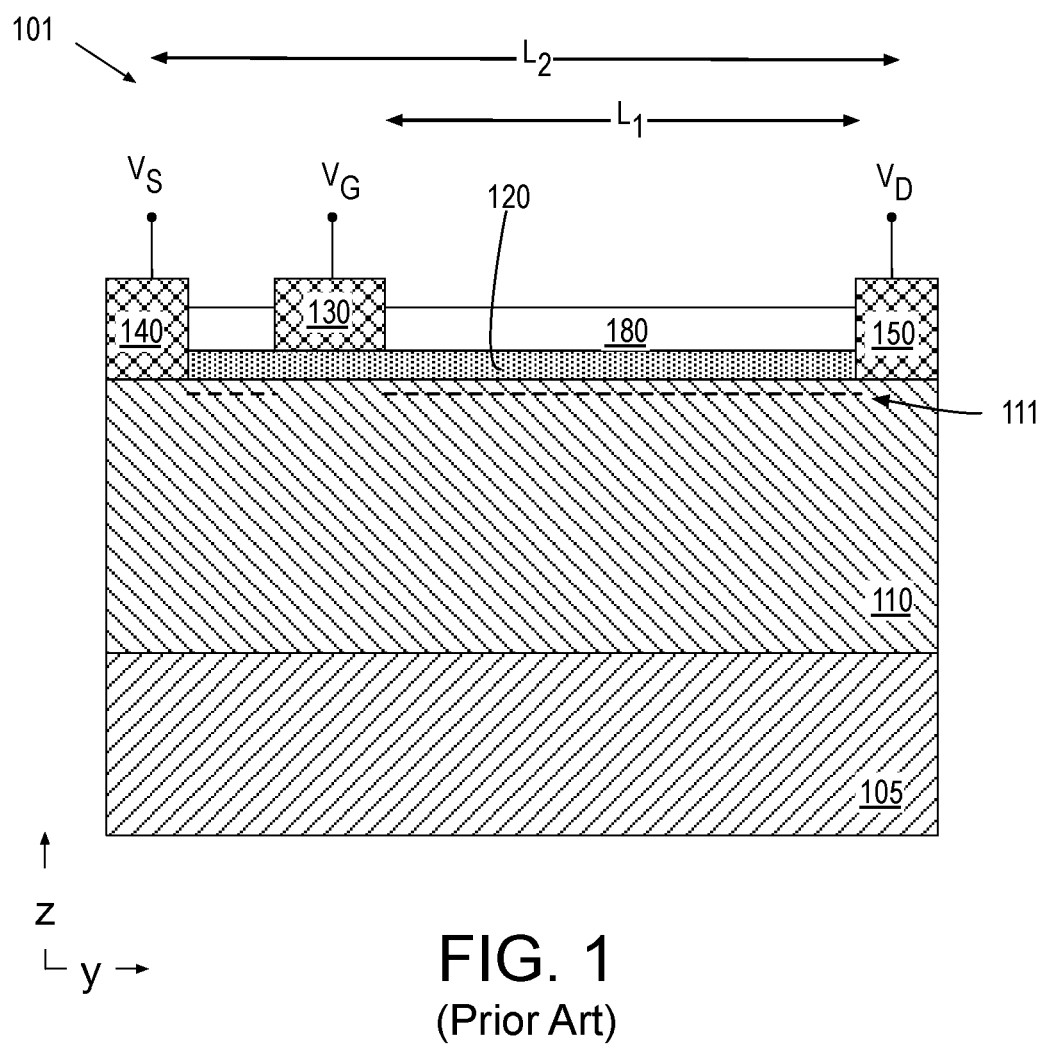
FIG. 1 illustrates a conventional lateral III-N power transistor, in accordance with embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring features of various embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are III-N transistors suitable for high voltage operation, and methods of fabricating such devices. In some exemplary embodiments, the III-N transistors are fabricated on a group IV substrate, such as silicon. In some embodiments, a vertically oriented lightly-doped III-N semiconductor functions as a carrier drift region separating heavily-doped III-N semiconductor (e.g., GaN, InN, AlN, InGaN and AlGaN) source and drain regions. A lateral III-N semiconductor channel region is further disposed between the source region and drift region. A gate electrode disposed over the channel region modulates a 2DEG within the channel region. Charge carriers may traverse a lateral distance from the source and enter the underlying drift region where the carriers then traverse a vertical distance to reach the underlying drain semiconductor. In accordance with some embodiments, functional regions of the device benefiting from the best crystal quality (e.g., the channel region) are located distal from the underlying heterogeneous substrate while other functional region more tolerant of a higher dislocation density are located proximal to the underlying substrate. As such, much of a III-N semiconductor layer's thickness may be utilized as functional components of a transistor, rather than merely exist as under-burden associated with heteroepitaxial growth. With a vertically oriented drift region, a given breakdown voltage may be achieved by targeting a thickness of the lightly doped III-N material, thereby decoupling device breakdown voltage from lateral device dimensions in a manner that enables a power transistor to be dimensionally scaled. In some embodiments, a self-aligned process is employed to form the III-N channel, drift, and drain regions.

Figure 2:
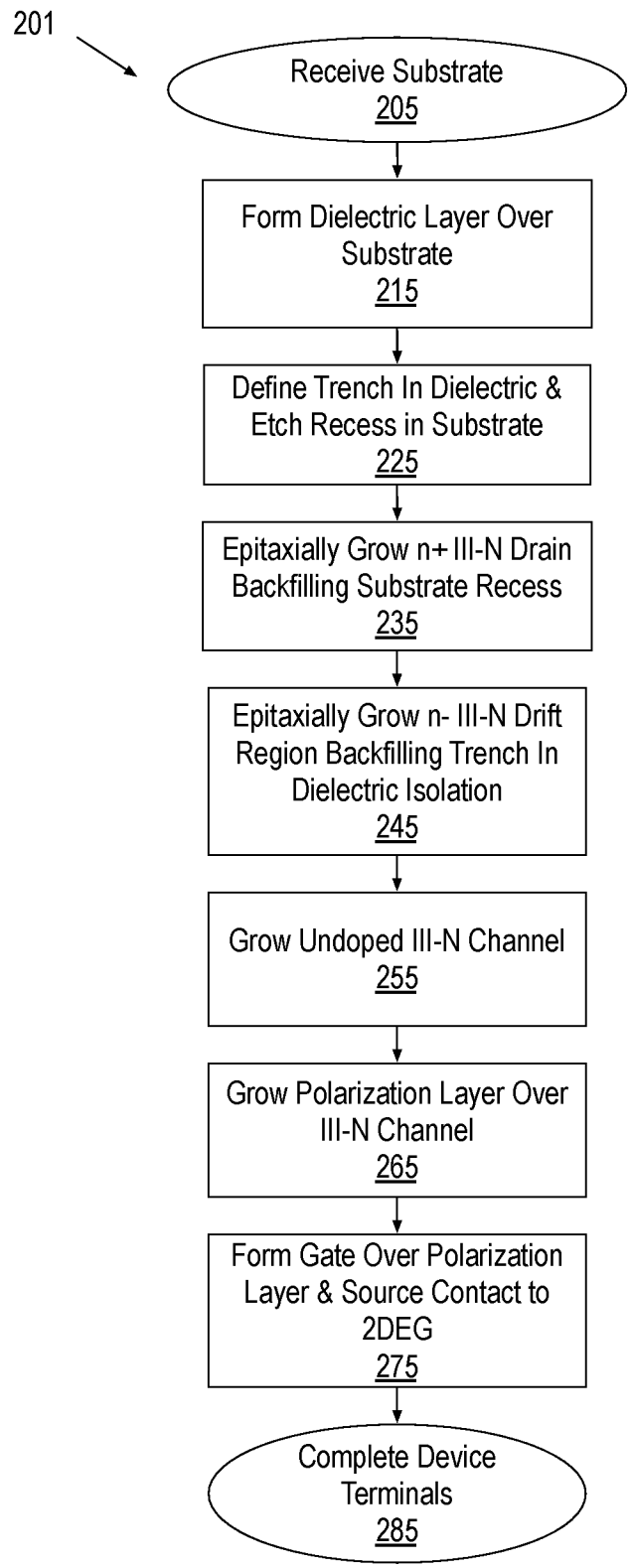
FIG. 2 is a flow diagram illustrating methods of forming a vertical III-N power transistor, in accordance with some embodiments.

FIG. 2 is a flow diagram illustrating methods 201 for forming a vertical III-N power transistor, in accordance with some embodiments. Methods 201 begin with receiving a substrate at operation 205. Various epitaxial growth processes and/or patterning processes may be employed upstream of methods 201 to prepare the substrate received at operation 205. For some advantageous embodiments, the substrate received at operation 205 comprises only group-IV materials (e.g., Si, Ge, SiGe). In some embodiments, the substrate received is a substantially monocrystalline (111) silicon substrate. Lattice mismatch between silicon and III-N crystals is most easily accommodated for the (111) plane. Nevertheless, other crystallographic orientations having greater lattice mismatch are also possible, such as, but not limited to, the (100), or (110) plane. A substrate may be bulk semiconductor or may be semiconductor on insulator (SOI). Substrate materials other than silicon are also possible, with examples including silicon carbide (SiC), sapphire, a III-V compound semiconductor (e.g., GaAs, InP). Substrates may have any level of impurity doping.

Methods 201 next pattern template regions and epitaxially grow III-N material within the template regions. Templating III-N growth may be advantageous because blanket epitaxial III-N growth process can suffer the effects of a large thermal mismatch between the substrate and the III-N material. Templating growth may also selectively grow the III-N material in a manner that rapidly terminates dislocations, improving III-N crystal quality for a given film thickness relative to blanket growths. In some exemplary embodiments, recesses are formed in the substrate and highly-doped III-N drain material is grown within the substrate recesses. Lightly-doped III-N material is then grown from a surface of the high-doped III-N material. In some exemplary embodiments, the technique of aspect ratio trapping (ART) is employed in at least the growth of the lightly-doped III-N material, for example to improve the quality of the III-N crystal relative to highly-doped III-N drain material. In some embodiments, III-N material growth may proceed incrementally, with one or more intervening processes between consecutive III-N growth operations. However, a single growth operation may form the drain, drift, and channel regions, as further described below in the context of the cross-sectional views provided FIGS. 3A, 3B, 3C, 3D, and 3E.

In some embodiments, methods 201 form a dielectric layer over the substrate at operation 215. The dielectric layer may be any amorphous dielectric material such as, but not limited to, alumina ($Al_2O_3$), silica (SiO), silicon nitrides (SiN), silicon oxynitrides (SiON), silicon carbonitrides (SiCN). The thickness of the dielectric layer may vary, for example as a function of the vertical length for the III-N drift region. In the exemplary embodiment illustrated in FIG. 3A, a dielectric layer 315 is deposited over a substrate 305. In some advantageous embodiments, dielectric layer 315 is deposited over a (111) silicon surface of substrate 305 and has a thickness of 1-5 μm.

Returning to FIG. 2, methods 201 continue at operation 225 wherein a trench is defined in the dielectric layer. The trench is to expose a portion of the underlying substrate surface. Operation 225 may entail any patterning process known to be suitable for the particular dielectric layer material selected. Lateral dimensions of the trench formed at operation 225 may vary as a function of the dielectric layer thickness, for example to achieve a trench aspect ratio suitable for ART of subsequently grown III-N material.

Exemplary trench aspect ratios are at least 3:1 (depth: width), and advantageously 8-10:1, or more. In some advantageous embodiments, the trench pattern formed at operation 225 is further employed to form recesses within the underlying substrate. For such embodiments, the substrate recesses are self-aligned to the trenches formed in the dielectric layer. Various techniques may be employed to form the substrate recesses, such as isotropic and anisotropic etches known to be suitable for the particular substrate composition. Exemplary anisotropic etch processes are crystallographic, having significant selectively (e.g., 20:1, or more) for one or more crystal planes over one or more other crystal planes. In some advantageous embodiments, the substrate recess etch is to significantly undercut the dielectric material layer, forming a recess extending laterally by a length sufficient to accommodate a predetermined minimum contact metallization pitch. In the exemplary embodiment further illustrated in FIG. 3B, a substrate recess 308 extends laterally below dielectric layer 315 in at least one dimension (e.g., y-dimension). In some embodiments where substrate 305 is (111) silicon, substrate recess 308 may be formed with a crystallographic etchants such as, but not limited to, TMAH-based or KOH-based chemistries.

Returning to FIG. 2, methods 201 continue at operation 235 where a heavily-doped (e.g., n+) III-N semiconductor is epitaxially grown on a surface of the substrate. In addition to functioning as a transition and/or buffer layer, at least a portion of the III-N material grown at operation 235 is to be enlisted as the drain of a power transistor. Epitaxial growth of the n+ III-N semiconductor crystal may utilize any known techniques, such as, but not limited to metal-organic chemical vapor deposition (MOCVD), or molecular beam epitaxy (MBE). In some embodiments, elevated temperatures of 900° C., or more, are employed at operation 235 to epitaxially grow the III-N drain material. In-situ doping is advantageously employed during growth to achieve a high impurity dopant concentration. III-N crystals can be highly doped n-type, and in advantageous embodiments the III-N drain crystal grown at operation 235 includes at least $1 \times 10^{18}$ impurity atoms/cm$^3$. In some embodiments, silicon is the n-type impurity dopant species introduced during the III-N drain growth operation.

One or more III-N alloy composition may be grown at operation 235, not all of which need be heavily impurity doped. In some advantageous embodiments, the heteroepitaxial growth at operation 235 is initiated with a low temperature nucleation step where a discontinuous film, such as AlN, is formed on the seeding surface of the channel crystal. The nucleation layer need not be doped n-type. In some embodiments, GaN is grown at operation 235. InGaN or AlGaN may also be grown at operation 235. In some embodiments, a stack of III-N materials is grown at operation 235. For example, following formation of an AlN nucleation layer, an undoped AlGaN and/or GaN crystal may be grown. Inclusion of an initial undoped layer over the substrate may improve drain-to-substrate isolation. Doped III-N material (e.g., doped GaN) may then be grown on the undoped material.

In some embodiments, the III-N drain crystal is hexagonal with the c-axis extending substantially orthogonal from the seeding surface of the substrate crystal. For example, the c-axis is substantially aligned with the <111> direction of the substrate for embodiments where the seeding surface is a (111) facet. "Substantially" aligned means the c-axis may be up to 5° off normal from the seeding surface facet. In the exemplary embodiment illustrated in FIG. 3C, heavily-doped III-N semiconductor 310 is grown primarily on a (111) seeding surface 309.

III-N hexagonal crystals lack inversion symmetry, and more particularly the {0001} planes are not equivalent. For the exemplary heavily-doped III-N (drain) semiconductor 310 illustrated in FIG. 3C, one of the {0001} planes is typically referred to as the Ga-face (+c polarity) and the other referred to as the N-face (−c polarity). In the exemplary embodiment, the {000-1} plane is more proximate the surface of substrate 305 and III-N semiconductor 310 may be referred to as Ga polarity (+c) because the three bonds of Ga (or other group III element) point towards substrate 305. For alternate embodiments where the three bonds of Ga (or other group III element) point away from the substrate, III-N semiconductor 310 would be referred to as N polarity (−c).

Crystal quality in heavily-doped III-N semiconductor 310 may vary as a function of the III-N material composition (e.g., Al, In, Ga, %), properties of the seeding surface, and III-N growth conditions. Noting there is significant lattice mismatch between an exemplary silicon substrate surface and III-N materials, crystal defects, such as threading dislocations may be present in III-N semiconductor 310. However, high defect densities (e.g., $1 \times 10^8$-$1 \times 10^{10}$ cm$^{-2}$) within III-N semiconductor 310 are more tolerable in a power transistor drain than in a 2DEG channel, for example.

Returning to FIG. 2, methods 201 continue to operation 245 where a lightly-doped (n−) III-N semiconductor is epitaxially grown from a surface of the n+ III-N semiconductor. The n− III-N semiconductor is to be enlisted as a drift region of a power transistor through which charge carriers are to flow vertically down to the n+ III-N semiconductor drain. Epitaxial growth of the n− III-N semiconductor crystal may again utilize any known techniques, such as, but not limited to MOCVD, or MBE. In advantageous embodiments, growth operation 245 is a portion of a multi-step epitaxial growth recipe that follows a prior recipe portion employed to grow the n+ III-N semiconductor. Here too, in-situ doping is advantageously employed during growth, but the impurity concentration is reduced below that of the n+ growth (e.g., by about two orders of magnitude) so as to achieve a desired semiconductor resistivity. In some, embodiments the III-N crystal grown at operation 245 includes around $1 \times 10^{16}$ impurity atoms/cm$^3$. Silicon is one exemplary n-type impurity dopant species that may be incorporated.

In advantageous embodiments, the n− III-N semiconductor is grown in a manner that significantly improves the crystal quality (i.e., lowers dislocation density) relative to that of the n+ III-N semiconductor grown at operation 235. In advantageous embodiments, at least a portion of the n− III-N semiconductor grown at operation 245 backfills the trench formed in the dielectric layer. In other words ART is employed during the growth the n− III-N semiconductor. Many dislocations propagating from the underlying n+ III-N material will be terminated at the trench sidewalls. Whether or not ART is not enlisted, confining the n− III-N material within the dielectric trench advantageously controls the lateral dimensions of the n− III-N material to achieve a desired extrinsic drain resistance.

Figure 3A:
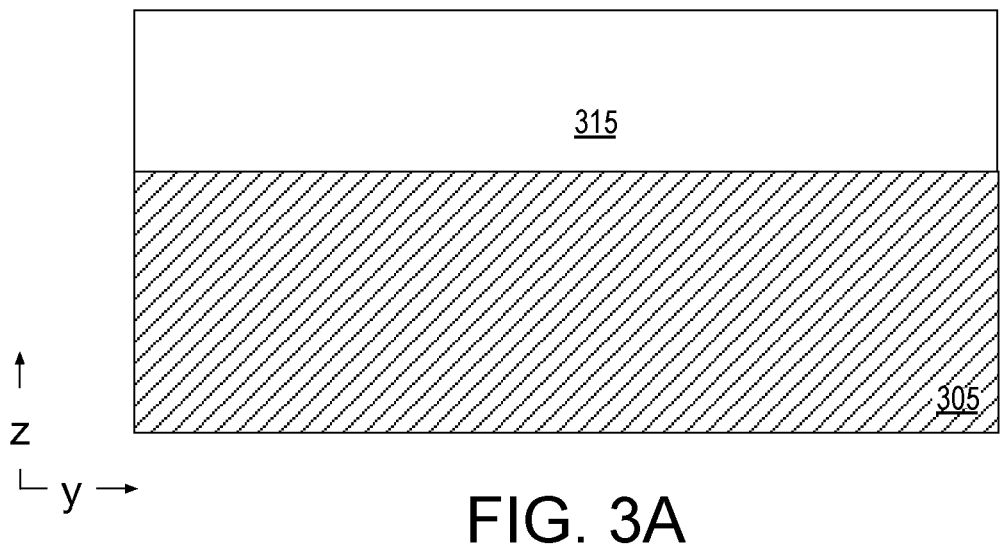
FIGS. 3A, 3B, 3C, 3D, and 3E are cross-sectional views of vertical III-N power transistor structures as selected operations in the method illustrated in FIG. 2 are performed, in accordance with some embodiments.
Figure 3B:
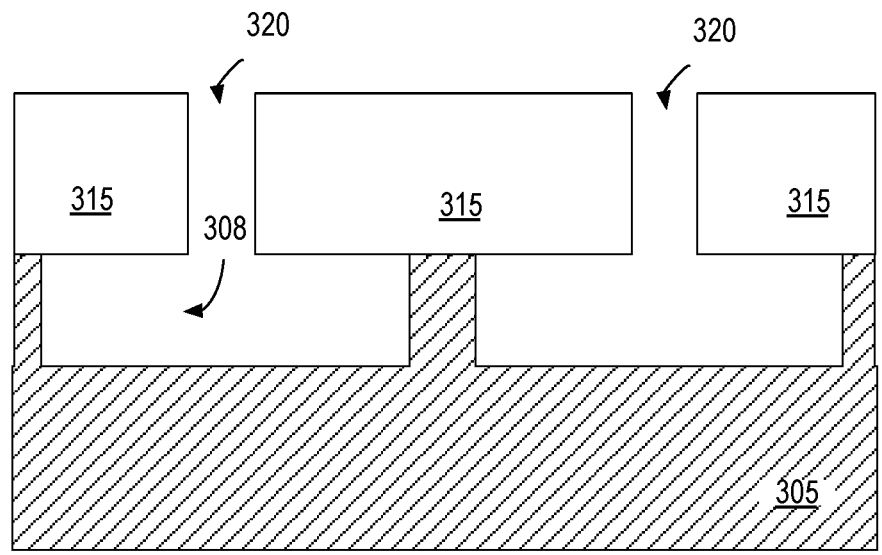
Figure 3C:
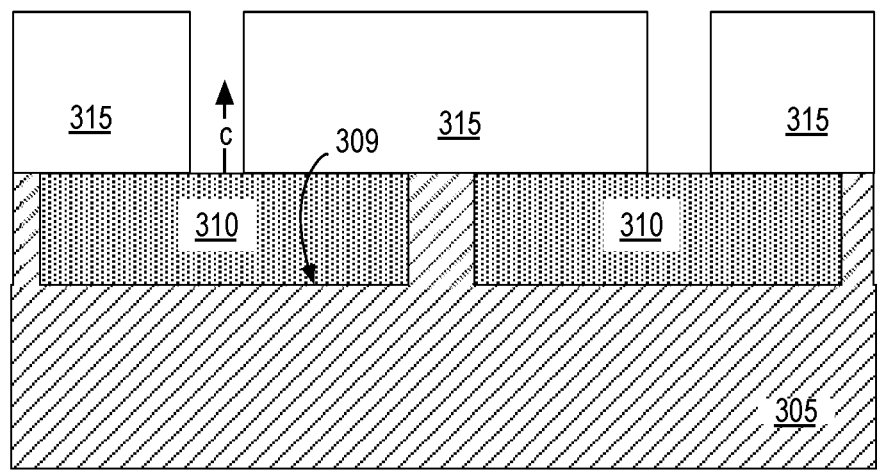
Figure 3D:
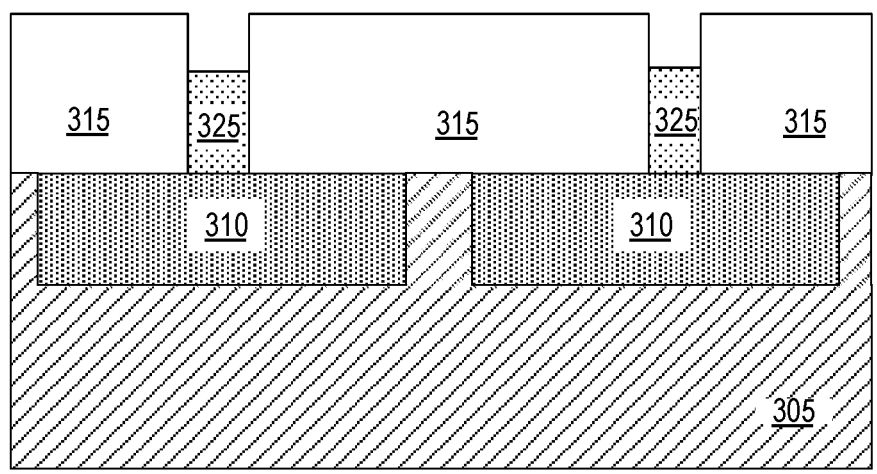

In the example further illustrated in FIG. 3D, the interface between n− III-N semiconductor 325 and III-N semiconductor 310 is approximately planar with a bottom surface of dielectric layer 315. For such embodiments, the n− III-N drift region may have a vertical length approximately equal to the z-thickness of dielectric layer 315. However, the transition between the n− and n+ doped semiconductors 325, 310 may be elsewhere as a function of the growth front location when the impurity source partial pressure is reduced during the epitaxial growth. One or more III-N alloy composition may be grown at operation 245. In some embodiments, n– GaN is grown at operation 245. Alternatively, n– InGaN or n– AlGaN may also be grown at operation 245. In some advantageous embodiments, the only precursor modulated between growth operations 235 and 245 is the impurity source. In FIG. 3D, for example, an n– GaN semiconductor 325 is disposed on n+ GaN semiconductor 310.

Figure 3E:
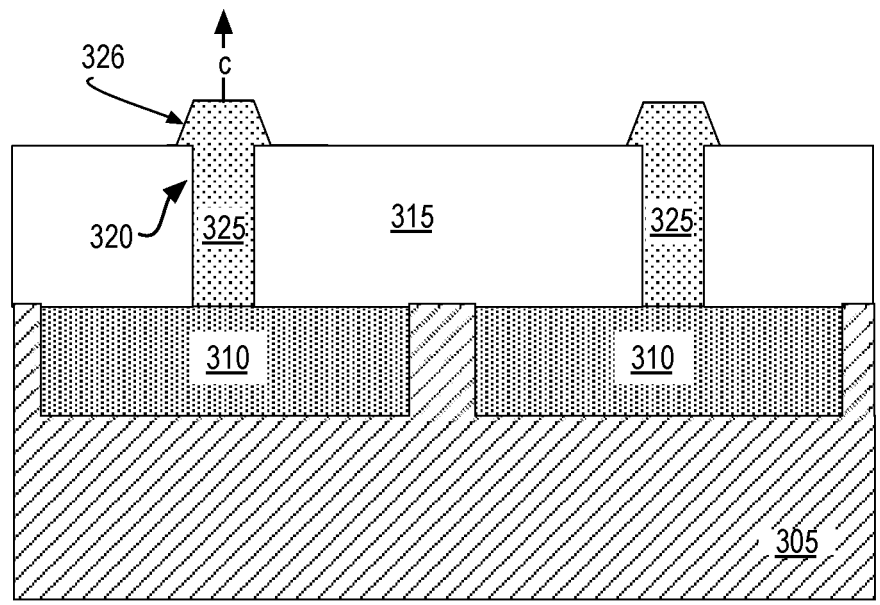

In some embodiments, the n– III-N epitaxial growth is continued until the n– III-N semiconductor extends above a top surface of the dielectric trench. First epitaxial growth conditions (e.g., a first III-N growth pressure, a first III-N growth temperature, and a first V/III growth precursor ratio) may be employed to fill the trench at which point the growth conditions may be modified to promote lateral epitaxial overgrowth (LEO). In some embodiments, LEO of III-N material favors formation of inclined semi-polar sidewall facets. Higher growth pressure, for example, favors these inclined semi-polar planes. In some exemplary GaN embodiments, the lateral epitaxial overgrowth pressure is in the range of 30-350 Torr. A lower growth temperature also favors the inclined planes, for example. In some exemplary GaN embodiments, the lateral epitaxial overgrowth temperature is in the range of 950-1150° C. A higher V/III ratio also favors the formation of inclined planes, for example. In some exemplary GaN embodiments where the group V precursor is $NH_3$ and the group III precursor is tri-methyl-gallium (TMG), the V/III ratio is in the range of 100-5000. In some embodiments, the impurity dopant is maintained as it was for the n– III-N growth within the trench. FIG. 3E illustrates an exemplary embodiment where continued epitaxial growth of the n– GaN semiconductor 325 forms inclined, semi-polar sidewall facets 326 as the III-N crystal expands laterally over dielectric layer 315. Sidewall facets 326 may, for example, have a normal vector that is approximately 60° from the c-axis. With sufficient growth time, sidewall facets 326 will intersect, forming a peaked III-N semiconductor structure profile in the y-z plane. For such a structure, the only c-plane present is at the apex aligned with the centerline or axis of each n– drift region. N-growth may be terminated before or after the inclined sidewall facets intersect to form a peak.

Figure 4:
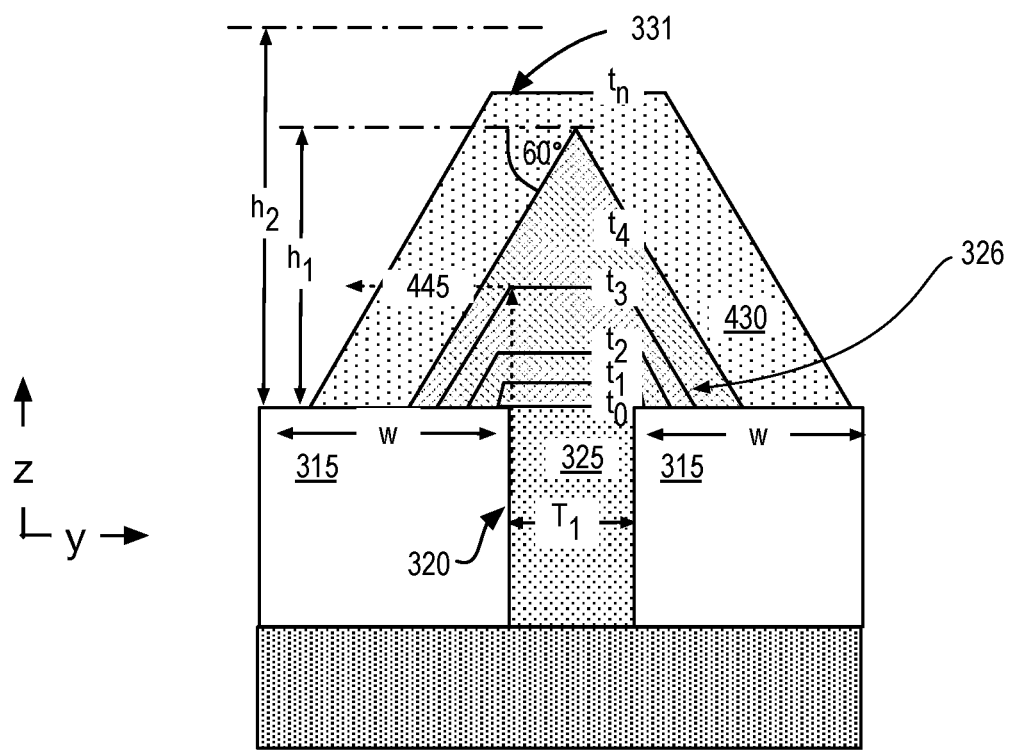
FIG. 4 is a cross-sectional illustration depicting growth front advancement for a faceted III-N crystal epitaxially grown from a trench, in accordance with some embodiments.

FIG. 4 is a cross-sectional illustration further depicting growth front advancement for a faceted III-N crystal laterally overgrown from a trench, in accordance with some embodiments. Generally, n– III-N semiconductor 325 contained within trench 320 can be expected to include a plurality of threading dislocations extending from the exposed surface of the substrate, and through a z-height of the trench 320. ART may have terminated defects propagating in parallel to the c-plane (perpendicular to the c-axis). LEO may further bend vertically propagating defects toward one of the pair of inclined sidewall facets. As shown in FIG. 4, at least some of threading dislocation defects 445 vertically gliding within trench 320 bend away from the c-axis at some z-height above dielectric layer 315 to horizontally glide to inclined sidewall facets 326. In FIG. 4, the profile at time to corresponds to a point when n– III-N semiconductor 325 is just ready to emerge from trench 320, which has a lateral width $T_1$. At time $t_0$ defects are propagating in the vertical direction (e.g., substantially parallel to the c-axis), as denoted by dashed lines. At time $t_3$, after some duration of LEO, III-N semiconductor 325 has expanded beyond the trench sidewall and the inclined sidewall facet(s) favored by LEO emerge. An inclined sidewall facet intersects defect 445 proximal to the trench sidewall, and the direction of the defect's propagation becomes lateral (e.g., substantially parallel to the c-plane). This bending of defect propagation continues until the inclined sidewall facets favored by the LEO process (e.g., ~60°) intersect each other at time $t_4$ to form a peaked n– III-N semiconductor with an apex at height $h_1$. After time $t_4$, only defects nearly coincident with a centerline of trench 320 can continue to vertically propagate. Generally, for smaller trench width $T_1$, III-N semiconductor will reach an apex sooner and additional LEO increases z-height with low defect density material having a top surface 331 that is substantially planar with the c-plane.

Returning to FIG. 2, methods 201 continue at operation 255 where a substantially undoped (i.e., not intentionally doped), or very lightly doped (e.g., at least 2 orders of magnitude more lightly doped than the n– doped drift region) III-N channel semiconductor is epitaxially grown from a surface of the n– III-N material. The III-N channel semiconductor is to be employed as the transistor channel region through which charge carriers are to flow laterally from an adjacent source and then down into the n– III-N semiconductor drift region. One or more III-N alloy composition may be grown at operation 255. In some embodiments, GaN is grown at operation 255. Alternatively, InGaN or AlGaN may also be grown at operation 255. In some advantageous embodiments, the only precursor modulated between growth operations 255 and 245 is the impurity source. For example, a GaN semiconductor channel region may be formed on a n– GaN semiconductor drift region. Epitaxial growth of the undoped III-N semiconductor crystal may again utilize any known techniques, such as, but not limited to MOCVD, or MBE. In advantageous embodiments, growth operation 255 is merely a recipe portion in a multi-step epitaxial growth recipe that follows a prior recipe portion employed to grow the n– III-N semiconductor. A transition between n– doping and substantially undoped III-N material may be made at any time during the LEO overgrowth process, for example by turning off the donor impurity source while maintaining other growth conditions.

Figure 5A:
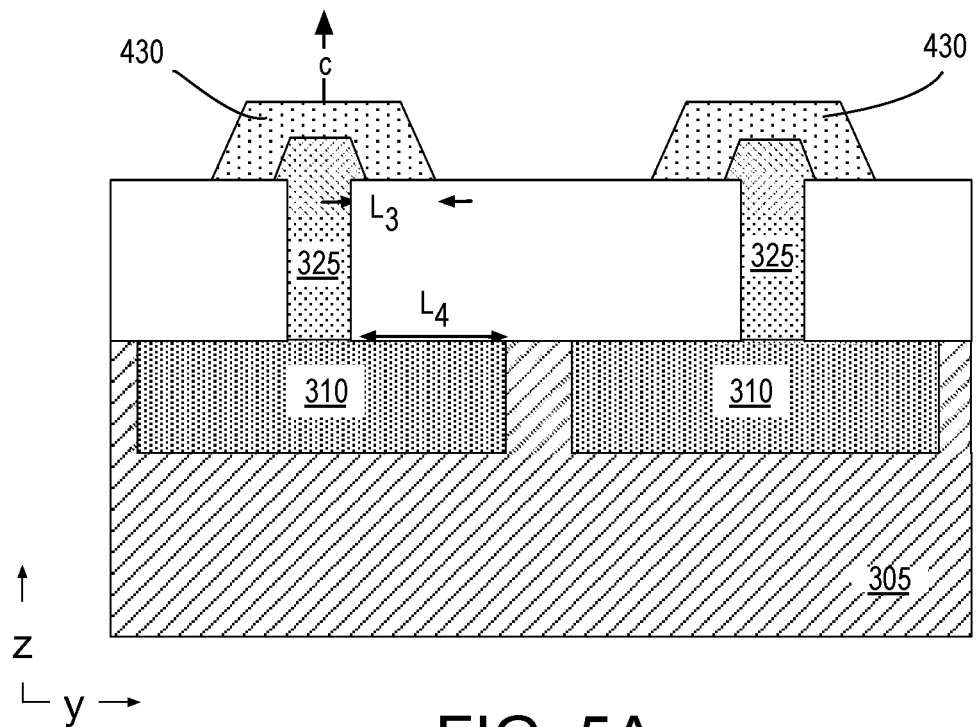
FIGS. 5A, 5B, 5C, and 5D are cross-sectional views of vertical III-N power transistor structures as selected operations in the method illustrated in FIG. 2 are performed, in accordance with some embodiments.

The geometry of the interface between an n– III-N drift region and III-N may vary from peaked to trapezoidal as a function of when the impurity source is terminated during the LEO III-N growth. For example, in FIG. 4 an undoped III-N semiconductor 430 is grown over a peaked n– III-N semiconductor 325. FIG. 5A further illustrates an embodiment where undoped III-N semiconductor 430 is grown over a trapezoidal n– III-N semiconductor 325. LEO growth conditions may be maintained during III-N semiconductor 430 growth to continue expanding the III-N semiconductor island laterally to be of sufficient size to host gate and source terminals. Advantageously, lateral growth of III-N semiconductor 430 is limited to a lateral length $L_3$ smaller than lateral length $L_4$ of the n+ III-N semiconductor 310 so that drain contact metallization adjacent to III-N semiconductor 430 may extend down to n+ III-N semiconductor 310, as further described below.

In the example illustrated in FIG. 5A, III-N semiconductor 430 has a top surface that is substantially parallel with the c-plane. Crystal quality of III-N semiconductor 430 is generally better than that of the n+ III-N semiconductor 310 and also superior to the n– III-N semiconductor 325. In some embodiments, threading dislocation density within III-N semiconductor 430 is at least two orders of magnitude lower than within III-N semiconductor 310, and therefore of sufficient quality for the fabrication of a 2DEG channel. In advantageous embodiments, threading dislocation density with III-N semiconductor 430 is $1\times10^7$-$1\times10^9$ cm$^{-2}$. Lateral epitaxial overgrowth of semiconductor 430 therefore facilitates high crystal quality and also expands the lateral footprint of islands of III-N material in a "bottom-up" manner that is self-aligned to the underlying n– III-N semiconductor 325. As described further below, the lateral dimensions of the III-N semiconductor islands are to be sufficiently large to provide a substrate for both a gated channel and a source terminal, each positioned on the III-N semiconductor islands relative to n– III-N semiconductor 325.

Figure 5B:
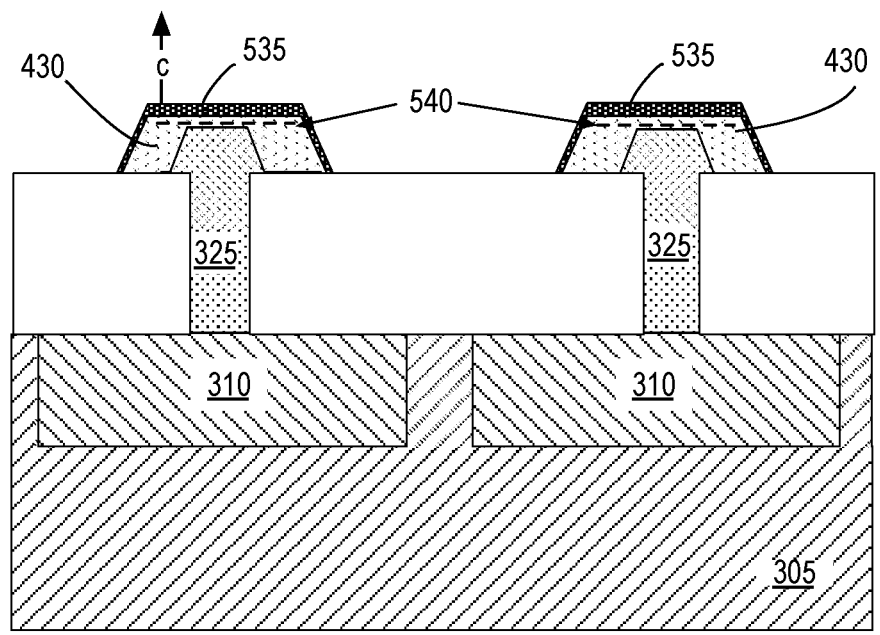

Returning to FIG. 2, methods 201 continue at operation 265 where a III-N polarization layer is epitaxially grown over the III-N channel semiconductor formed at operation 255. The III-N alloy employed as the polarization layer may have any composition suitable for the composition of the III-N channel semiconductor. In some exemplary embodiments further illustrated in FIG. 5B, a semiconductor polarization layer 535 comprising AlGaN is grown over a GaN channel semiconductor 430. Epitaxial growth of the polarization layer may again utilize any known techniques, such as, but not limited to MOCVD, or MBE. In advantageous embodiments, the polarization layer growth is merely a recipe step in a multi-step epitaxial growth recipe that follows a prior recipe step employed to grow the III-N channel semiconductor. As further shown in FIG. 5B, in the presence of polarization layer 535, a 2DEG 540 forms within III-N channel semiconductor 430. The 2DEG 540 is therefore disposed between polarization layer 535 and an interface with n– III-N semiconductor 325.

Returning to FIG. 2, methods 201 continue at operation 275 where a gate electrode is formed over the channel semiconductor in a manner suitable to modulate the 2DEG between the gate and the underlying n– III-N semiconductor. Because of the lateral epitaxial overgrowth, polarization layer 535 is of sufficient lateral dimension for a gate electrode to occupy at least the same lateral dimensions as that of the n– III-N semiconductor 325. In some advantageous embodiments, the gate electrode is recessed to ensure enhancement mode operation of the power transistor. Operation 275 may further entail growing another n+ doped III-N crystal that is to function as a semiconductor source region of the power transistor. In some embodiments, operation 275 entails forming a sacrificial gate stack over a channel region of the channel crystal, growing a n+ III-N source crystal, and then replacing the sacrificial gate stack with a final gate stack. Alternatively, in a "gate-first" technique, operation 275 may entail forming the final gate stack over the channel region and then forming a III-N source region.

Figure 5C:
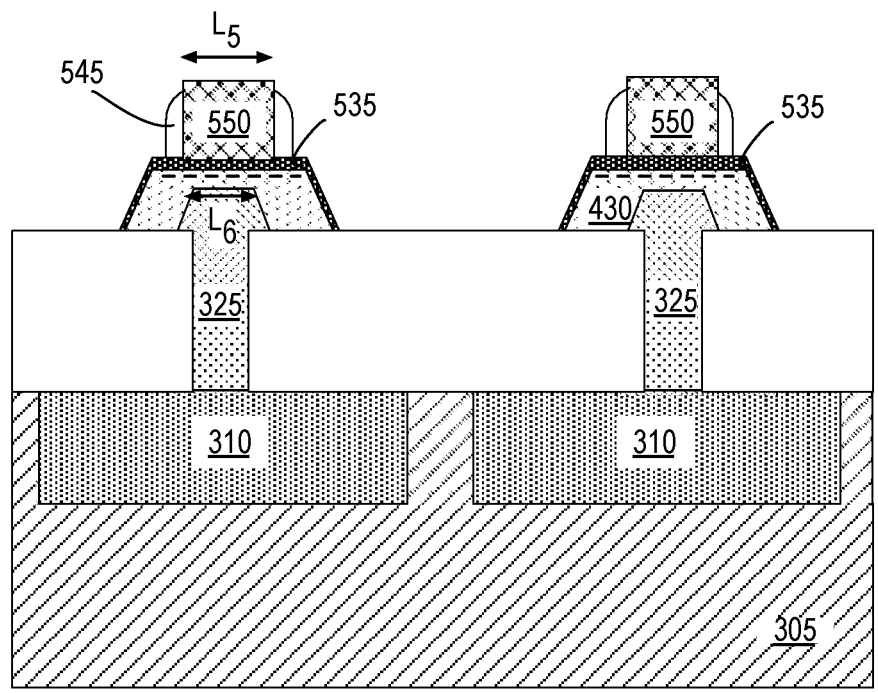
Figure 5D:
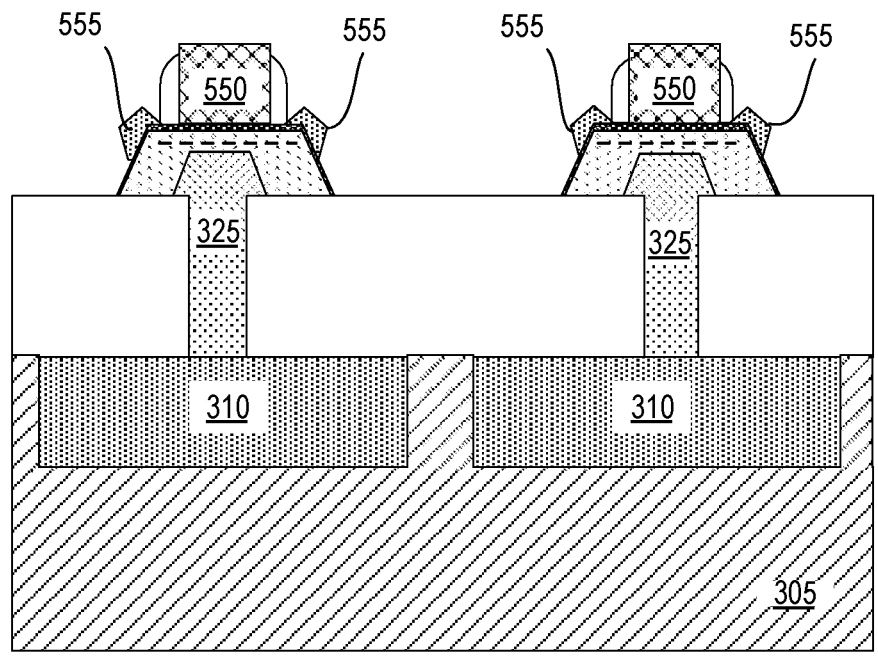

In the example illustrated in FIG. 5C, a lateral spacer 545 is disposed on either side of a sacrificial gate stack that includes a gate mandrel 550. Lateral spacer 545 may be any known dielectric, such as, but not limited to SiO, SiN, SiON, SiCN, etc. Gate mandrel 550 may comprise polysilicon or other suitable material, for example providing etch selectivity to lateral spacer 545. Gate mandrel 550 is to be aligned over the n– III-N semiconductor. Lateral dimensions of gate mandrel 550 ($L_5$) are advantageously larger than the lateral dimensions ($L_6$) of a top surface of n– III-N semiconductor 325 to ensure a replacement gate electrode will have sufficient overlap with n– III-N semiconductor 325 for transistor current control. With the (sacrificial) gate stack protecting the channel region, one or more source contacts can be formed. In some embodiments, the source region comprises an alloy with contact metallization. Alternatively, a n+ doped III-N source crystal may be grown on exposed portions of the polarization layer, or channel semiconductor. Epitaxial growth of the n+ III-N source crystals may utilize any known techniques, such as, but not limited to MOCVD, or MBE. One or more III-N alloys may be grown as the source crystal. In-situ doping may be employed during growth operation to achieve a high impurity dopant concentration. In the example illustrated in FIG. 5D, heavily-doped III-N semiconductor crystals 555 (e.g., having Si levels of at least $3\times10^{20}$ atoms/cm$^3$) are grown on a surface of polarization layer 535. The addition of In to semiconductor crystals 555 (e.g., InGaN) may provide lower contact resistance than alternative GaN embodiments doped to a similar impurity level.

Returning to FIG. 2, method 201 is completed with the formation of the transistor terminals at operation 285. In some exemplary embodiments, formation of the gate terminal entails replacing a sacrificial gate stack with a permanent gate stack having properties suitable for the channel crystal. Portions of the polarization layer exposed upon removal of a sacrificial gate stack may be recessed etched to set a threshold voltage of the power transistor. In advantageous embodiments, threshold voltage is set for an n-type enhancement mode device.

Figure 6A:
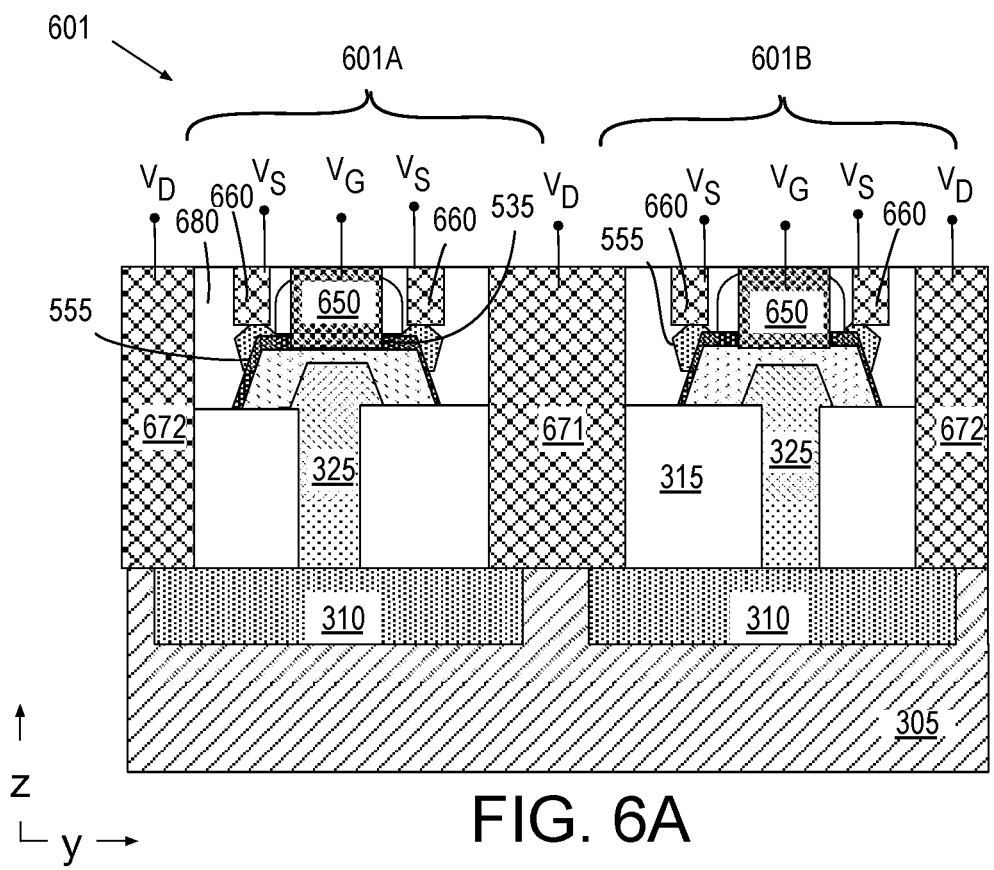
FIG. 6A is a cross-sectional view of vertical III-N power transistors in an off-state, in accordance with some embodiments

FIG. 6A is a cross-sectional view of an IC 601 including a pair of vertical III-N power transistors 601A and 601B, in accordance with some embodiments. IC 601 may be the result of practicing methods 201 (FIG. 2), for example. As shown in FIG. 6A, a gate electrode 650 has replaced the gate mandrel. Gate electrode 650 has been recessed, with no polarization layer 535 between the channel semiconductor and gate electrode 650. Transistor 601 may therefore be operable as an enhancement mode device with no 2DEG present in a lateral channel region at zero volts of gate bias. With proper lateral spacing between the source semiconductor 555 and n– drift region semiconductor 325, current between the two may be nearly nil in absence of a 2DEG below gate electrode 650 when VG=0V. Power transistors 601A and 601B are further illustrated with source contact metallization 660 and drain metallization 671 and 672. Notably, the source and drain metallization is all top-side and at a pitch that can be scaled independent of a length of the transistor drift region. In the illustrated example, drain contact metallization 671 extends down through interlayer dielectric 680 as well as dielectric layer 315 to land on n+ doped III-N semiconductor 310. In the illustrated embodiment, lateral dimensions of drain contact metallization 671 are sufficient to contact two adjacent n+ doped semiconductors 310, each associated with one of the transistors 601A and 601B. In addition to shared drain contact metallization 671, a drain contact metallization 672 is disposed on an opposite side of gate electrode 650, which may reduce current crowding within n+ doped semiconductor 310. Transistors 601A, 601B further include symmetrical pairs of source contact metallization 660 disposed on opposite sides of each gate electrode 650.

Figure 6B:
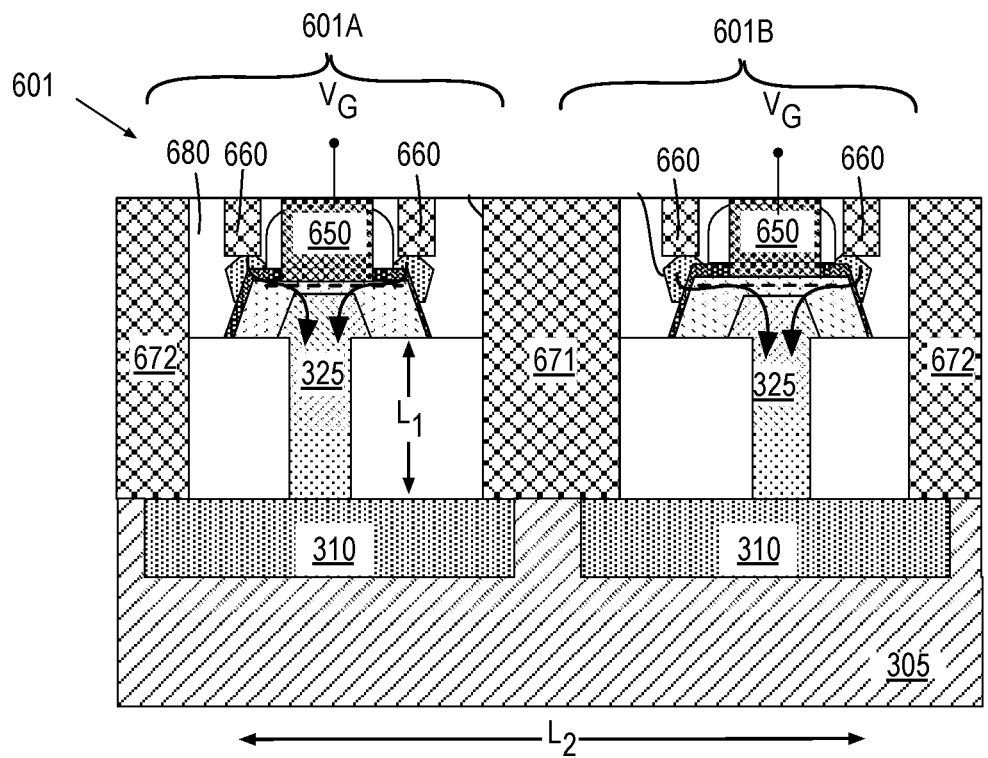
FIG. 6B is a cross-sectional view of the vertical III-N power transistors illustrated in FIG. 6A in an on-state, in accordance with some embodiments.

FIG. 6B further illustrates IC 601 in an on-state with arrows illustrating carrier passage between source and drain through the vertical drift region. With VG>0V, a 2DEG forms under gate electrode 650, enabling carriers to enter n– doped III-N drift semiconductor 325 and resulting in current between source contact(s) 660 and drain contacts 671, 672. As further annotated in FIG. 6B, the pair of transistors 601A and 601B may occupy a region of substrate 305 characterized by lateral length $L_2$, which for example is approximately equal to the source-drain pitch $L_2$ of the single conventional lateral transistor 101 introduced in FIG. 1. Despite the lateral source-drain pitch scaling, breakdown voltage for transistors 601A, 601B may be at least as high as for conventional lateral transistor 101 because n– doped III-N drift semiconductor 325 extends vertically by length $L_1$. Indeed, with n– doped III-N drift semiconductor 325 buried deeply within dielectric layer 315 surface passivation issues typical of lateral drift regions may be significantly reduced, enabling transistors 601A, 601B to have higher breakdown voltages than lateral devices for a given gate-drain pitch.

Figure 7:
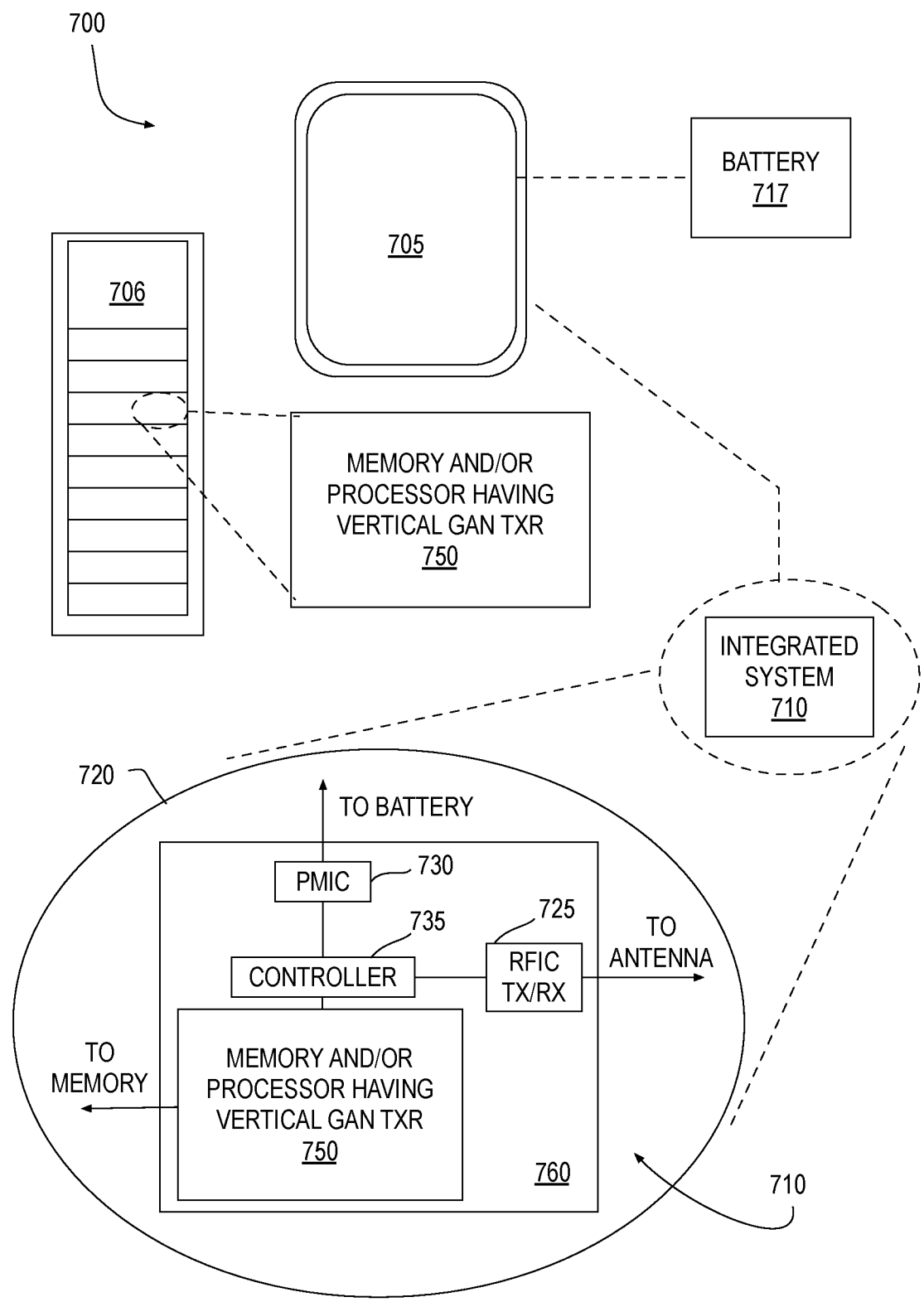
FIG. 7 illustrates a mobile computing platform and a data server machine employing an SoC including vertical III-N power transistors, in accordance with embodiments.

FIG. 7 illustrates a system 700 in which a mobile computing platform 705 and/or a data server machine 706 employs an IC including at least one vertical III-N power transistor having a vertical drift region and a lateral gate modulated channel region, for example as describe elsewhere herein. The server machine 706 may be any commercial server, for example including any number of high-performance computing platforms disposed within a rack and networked together for electronic data processing, which in the exemplary embodiment includes a packaged monolithic IC 750. The mobile computing platform 705 may be any portable device configured for each of electronic data display, electronic data processing, wireless electronic data transmission, or the like. For example, the mobile computing platform 705 may be any of a tablet, a smart phone, laptop computer, etc., and may include a display screen (e.g., a capacitive, inductive, resistive, or optical touchscreen), a chip-level or package-level integrated system 710, and a battery 717.

Whether disposed within the integrated system 710 illustrated in the expanded view 720, or as a stand-alone packaged chip within the server machine 706, packaged monolithic IC 750 includes a memory chip (e.g., RAM), or a processor chip (e.g., a microprocessor, a multi-core microprocessor, graphics processor, or the like) including at least one vertical III-N power transistor having a vertical drift region and a lateral gate modulated channel region, for example as describe elsewhere herein. The monolithic IC 750 may be further coupled to a board, a substrate, or an interposer 760 along with, one or more of a power management integrated circuit (PMIC) 730, RF (wireless) integrated circuit (RFIC) 725 including a wideband RF (wireless) transmitter and/or receiver (TX/RX) (e.g., including a digital baseband and an analog front end module further comprises a power amplifier on a transmit path and a low noise amplifier on a receive path), and a controller thereof 735. One or more of PMIC 730 and RFIC 725 may include at least one vertical III-N power transistor having a vertical drift region and a lateral gate modulated channel region, for example as describe elsewhere herein.

Functionally, PMIC 730 may perform battery power regulation, DC-to-DC conversion, etc., and so has an input coupled to battery 717 and with an output providing a current supply to other functional modules. As further illustrated, in the exemplary embodiment, RFIC 725 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 750 or within a single IC coupled to the package substrate of the monolithic IC 750.

Figure 8:
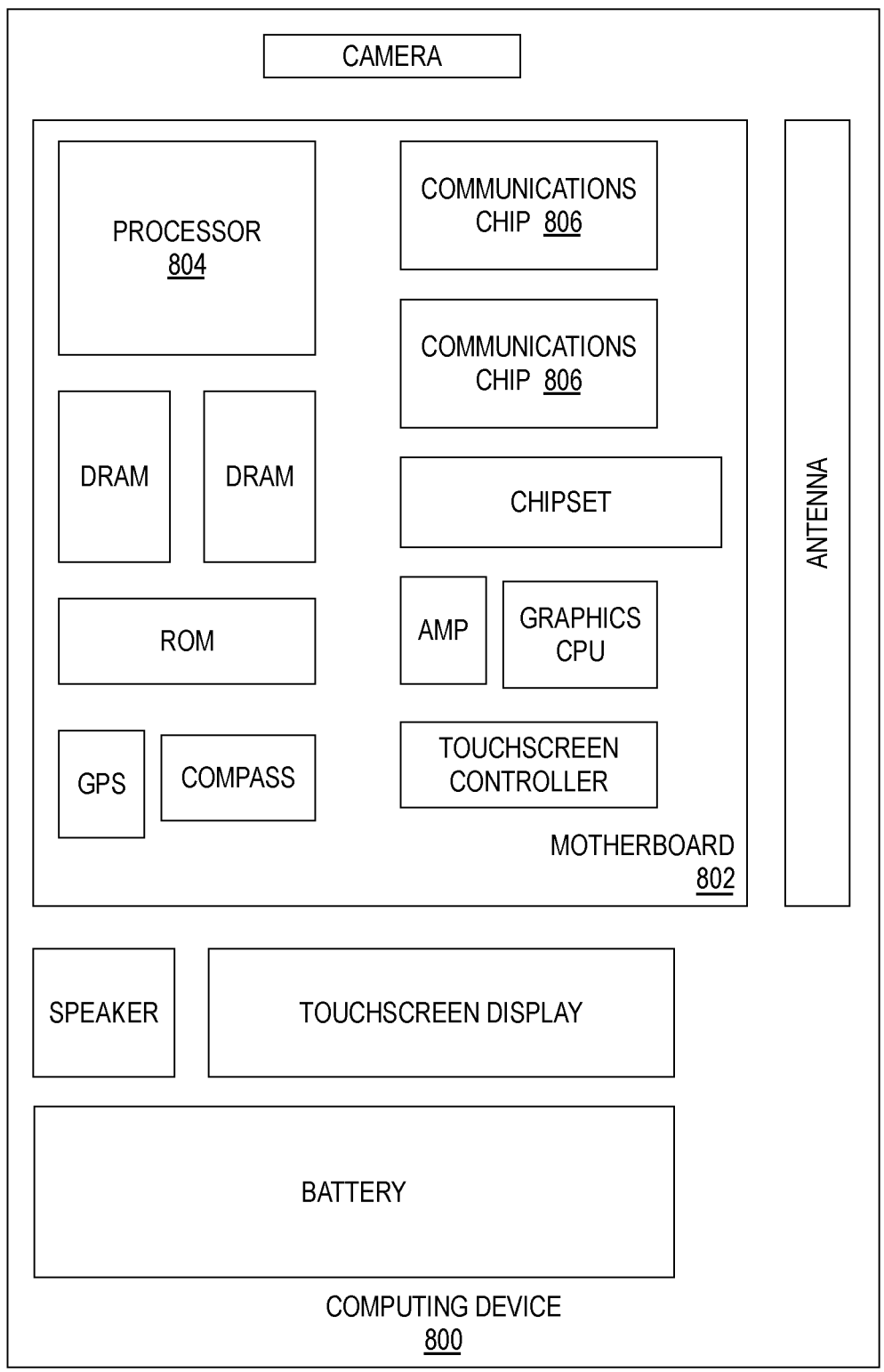
FIG. 8 is a functional block diagram of an electronic computing device, in accordance with some embodiments.

FIG. 8 is a functional block diagram of a computing device 800, arranged in accordance with at least some implementations of the present disclosure. Computing device 800 may be found inside platform 705 or server machine 706, for example. Device 800 further includes a motherboard 802 hosting a number of components, such as, but not limited to, a processor 804 (e.g., an applications processor), which may further incorporate at least one finFET including a heteroepitaxial III-N source/drain, in accordance with some embodiments. Processor 804 may be physically and/or electrically coupled to motherboard 802. In some examples, processor 804 includes an integrated circuit die packaged within the processor 804. In general, the term "processor" or "microprocessor" may refer to any device or portion of a device that processes electronic data from registers and/or memory to transform that electronic data into other electronic data that may be further stored in registers and/or memory.

In various examples, one or more communication chips 806 may also be physically and/or electrically coupled to the motherboard 802. In further implementations, communication chips 806 may be part of processor 804. Depending on its applications, computing device 800 may include other components that may or may not be physically and electrically coupled to motherboard 802. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 906 may implement any of a number of wireless standards or protocols, including but not limited to those described elsewhere herein. As discussed, computing device 800 may include a plurality of communication chips 806. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that embodiments other than those described in detail above may be practiced with modification and alteration without departing from the scope of the appended claims. For example the above embodiments may include specific combinations of features as further provided below:

In some first embodiments, a III-N transistor comprises, a heavily-doped III-N drain disposed over a surface of a substrate, a lightly-doped III-N drift region disposed over the drain, a III-N channel disposed over the drift region, a gate electrode disposed over the channel, and a heavily-doped source coupled to the channel.

In furtherance of the first embodiments, the transistor further comprises an amorphous dielectric material disposed over a portion of the drain, and the drift region is disposed within a trench extending through the dielectric material.

In furtherance of the first embodiments, the source is one of a pair of n+ doped III-N semiconductor crystals, each source crystal contacting a surface of a III-N polarization layer or directly contacting the III-N channel on opposite sides of the gate electrode, and the transistor further comprises a pair of source contact metallizations, each landed on one of the pair of n+ doped III-N source crystals.

In furtherance of the first embodiments immediately above, the substrate comprises Si, the channel comprises GaN, and the transistor further comprise a pair of drain contact metallizations disposed on opposite sides of the gate electrode, and each drain contact metallization landed on an n+ doped III-N drain.

In furtherance of the first embodiments, the source and drains are each doped with a donor impurity to at least $3\times10^{18}$ atoms/cm$^3$, and the drift region is doped with a donor impurity to at less than $1\times10^{17}$ atoms/cm$^3$.

In furtherance of the first embodiments, the III-N channel has a dislocation density no more than $10^9$ cm$^{-2}$, and the heavily-doped III-N drain has a dislocation density that is at least an order of magnitude higher than that of the III-N channel.

In furtherance of the first embodiments, at least 3 µm of the drift region separates the source and drain.

In furtherance of the first embodiments, a c-plane of the III-N channel is no more than 10° from parallel to the surface of the substrate, and the III-N channel is disposed within an III-N island extending laterally beyond the trench, the island having inclined semi-polar sidewall facets sloping from a top polar surface of the III-N channel to an interface with the dielectric material layer disposed laterally beyond a sidewall of the trench.

In one or more second embodiments, an integrated circuit (IC), comprises a pair of III-N transistors disposed over a silicon substrate, each transistor further comprising a gate electrode disposed over a III-N channel region, a n+ doped III-N source coupled to the III-N channel region on either side of the gate electrode, and a n+ doped III-N drain disposed on a side of the channel region opposite the gate electrode and coupled to the III-N channel region through an n– doped III-N drift region. The IC further comprises a common drain contact disposed between the n+ doped III-N sources and landing on the n+ doped III-N drain of each transistor.

In furtherance of the second embodiment, the III-N channel region comprises undoped GaN disposed between the n– doped III-N drift region, and the gate electrode, and the n– doped III-N drift region has a thickness between interfaces with the drain and the channel region, of at least 3 µm.

In one or more third embodiments, a method of forming a III-N transistor comprises epitaxially growing a first n+ doped III-N semiconductor on a substrate, epitaxially growing a n– doped III-N semiconductor from a surface of the first n+ doped III-N semiconductor to backfill a trench in a dielectric layer disposed over a portion of the n+ doped III-N semiconductor, epitaxially growing a III-N channel semiconductor from a surface of the n– doped III-N semiconductor, forming a gate electrode over the III-N channel semiconductor, and forming first contact metallization through the dielectric layer and contacting the first n+ doped III-N semiconductor, and forming second contact metallization coupling to the III-N channel semiconductor.

In furtherance of the third embodiments, the method further comprises depositing the dielectric layer over the substrate, patterning the trench through the dielectric layer, exposing the substrate, etching a recess into the substrate as masked by the trenched dielectric layer, and backfilling the substrate recess by epitaxially growing the first n+ doped III-N semiconductor.

In furtherance of the third embodiments immediately above, the substrate is silicon, a (111) surface of the silicon is exposed at the bottom of the trench, and etching the recess comprises performing a crystallographic etch that undercuts the dielectric layer by a lateral distance at least equal to a pitch between the gate electrode and the first contact metallization.

In furtherance of the third embodiments, epitaxially growing the III-N channel semiconductor comprises lateral epitaxial growth of GaN.

In furtherance of the third embodiments, epitaxially growing the n– doped III-N semiconductor comprises growing the n– doped III-N semiconductor to extend above a top surface of the dielectric layer. and epitaxially growing the III-N channel semiconductor comprises lateral epitaxial growth of substantially undoped GaN from a surface of the n– doped III-N semiconductor extending above the top surface of the dielectric layer.

In furtherance of the third embodiments, the method further comprises epitaxially growing a III-N polarization layer from a surface of the III-N channel semiconductor, epitaxially growing a second n+ doped III-N semiconductor from a surface of at least one of the polarization layer or III-N channel semiconductor, and landing the second contact metallization on the second n+ doped III-N semiconductor.

In furtherance of the third embodiments immediately above, epitaxially growing the first n+ doped III-N semiconductor comprises growing GaN doped with a donor impurity of at least $3\times10^{18}$ atoms/cm$^3$, epitaxially growing the III-N channel semiconductor comprises growing GaN with an impurity concentration below $3\times14$ atoms/cm$^3$, and epitaxially growing the second n+ doped III-N semiconductor comprises growing InGaN doped with a donor impurity of at least $3\times10^{18}$ atoms/cm$^3$.

In one or more fourth embodiments, a method of fabricating an integrated circuit comprises forming a pair n+ doped III-N semiconductor drains over two adjacent substrate regions, epitaxially growing an n– doped III-N semiconductor drift region from each of the pair of drains, the growing confined to within a trench in a dielectric layer disposed over a portion of the drains, epitaxially growing a pair of III-N semiconductor islands from a surface of the n– doped III-N semiconductor with growth conditions that expand the III-N semiconductor islands laterally over a top surface of the dielectric layer, forming a pair of gate electrodes, over a channel portion of the III-N semiconductor islands, and forming first contact metallization through the dielectric layer and contacting both of the pair of III-N drains.

In furtherance of the fourth embodiments, the method further comprises epitaxially growing a III-N polarization layer on each of the III-N semiconductor islands, and epitaxially growing a pair of n+ doped III-N semiconductor sources over each of the III-N spacer islands on opposite sides of each gate electrode.

In furtherance of the fourth embodiments, the method further comprises depositing the dielectric layer over a substrate, patterning the trench through the dielectric layer, exposing the substrate, etching a pair of recesses into the substrate as masked by the trenched dielectric layer, and backfilling the pair of recesses by epitaxially growing the pair of n+ doped III-N semiconductor drains.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A III-N transistor, comprising:
a drain comprising a III-N material with an impurity at a first concentration;
a drift region over a portion of the drain, the drift region comprising a III-N material with an impurity at a second concentration, less than the first concentration;
a channel over the drift region, the channel comprising a III-N material;
a gate electrode over the channel;
a first and second source coupled to the channel, the first and second source comprising III-N material, and on opposite sides of the gate electrode;
a first source contact metallization in contact with the first source, and a second source contact metallization in contact with the second source; and
a pair of drain contact metallizations, individual ones of the pair of drain contact metallizations on opposite sides of the gate electrode, and each in contact with the drain.

2. The transistor of claim 1, further comprising:
an amorphous material over a portion of the drain; and wherein:
the drift region has a sidewall adjacent to a sidewall of the amorphous material; and
the amorphous material is between the drift region and individual ones of the pair of drain contact metallizations.

3. The transistor of claim 2, wherein:
a c-plane of the channel is no more than 10° from parallel to the surface of an underlying silicon substrate; and
the channel is within a body of III-N material that extends laterally beyond the sidewall of the amorphous material, the body of III-N material has inclined semi-polar sidewall facets sloping from a top polar surface of the channel to an interface with the amorphous material.

4. The transistor of claim 1, wherein the first source and second source are each in contact with a surface of a polarization layer comprising a III-N material, or in direct contact with the channel.

5. The transistor of claim 4, wherein
the drain is over a substrate layer comprising Si; and
the channel comprises Ga and N.

6. The transistor of claim 1, wherein:
the first source, second source, and the drain comprise a donor impurity having a concentration of at least $3 \times 10^{18}$ atoms/cm$^3$; and
the drift region comprises a donor impurity concentration that is less than $1 \times 10^{17}$ atoms/cm$^3$.

7. The transistor of claim 1, wherein:
the channel has a dislocation density no more than $10^9$ cm$^{-2}$; and
the drain has a dislocation density that is at least an order of magnitude higher than that of the channel.

8. The transistor of claim 1, wherein the drift region has a thickness of at least 3 μm between the channel and the drain.

9. An integrated circuit (IC), comprising:
a pair of III-N transistors over a silicon substrate, each transistor further comprising:
a gate electrode over a channel region, the channel region comprising a Group III element and nitrogen;
a source coupled to the channel region on either side of the gate electrode, the source comprising a Group III element, nitrogen, and a donor impurity having at least a first concentration;
a drain coupled to the channel region and opposite the gate electrode, wherein the drain is coupled to channel region through a drift region comprising a Group III element, nitrogen, and a donor impurity having a second concentration, less than the first concentration; and
a drain contact between a source of a first of the transistors and a source of a second of the transistors, wherein the drain contact is coupled to a drain of each of the transistors.

10. The IC of claim 9, wherein:
the channel region comprises undoped GaN between the drift region and the gate electrode; and
the drift region has a thickness between the drain and the channel region of at least 3 μm.

11. A method of forming a III-N transistor, the method comprising:
epitaxially growing a first III-N material on a substrate, the first III-N material comprising a first concentration of donor impurities;
epitaxially growing a second III-N material from a surface of the first III-N material to backfill a trench in an amorphous layer that is over a portion of the first III-N material, wherein the second III-N material has a second concentration of donor impurities, less than the first concentration;
epitaxially growing a third III-N material from a surface of the second III-N material;
forming a gate electrode over the third III-N material;
forming drain contact metallization through the amorphous layer and contacting the first III-N material; and
forming source contact metallization coupled to the third III-N material.

12. The method of claim 11, further comprising:
depositing the amorphous layer over the substrate;
patterning the trench through the amorphous layer, exposing the substrate;
etching a recess into the substrate as masked by the trenched dielectric layer; and
epitaxially growing the first III-N material within the recess.

13. The method of claim 12, wherein:
the substrate is silicon;
a (111) surface of the silicon is exposed at the bottom of the recess; and
etching the recess comprises performing a crystallographic etch that undercuts the amorphous layer by a lateral distance that is at least equal to a pitch between the gate electrode and the drain contact metallization.

14. The method of claim 11, further comprising:
epitaxially growing a polarization layer comprising a fourth III-N material from a surface of the third III-N material;

epitaxially growing a source from a surface of at least one of the third or fourth III-N materials, wherein the source comprises a fifth III-N material having a third concentration of donor impurities, exceeding the first concentration; and forming the source contact metallization on the second source.

15. The method of claim 14, wherein:

epitaxially growing the first III-N material comprises growing GaN with a first concentration of impurities that is at least $3 \times 10^{18}$ atoms/cm$^3$;

epitaxially growing the third III-N material comprises growing GaN with an impurity doping of no more than $3 \times 10^{14}$ atoms/cm$^3$; and epitaxially growing the second III-N material comprises growing an InGaN alloy with a donor impurity of at least $3 \times 10^{18}$ atoms/cm$^3$.

16. The method of claim 11, wherein epitaxially growing the third III-N material comprises lateral epitaxial growth of a crystal comprising Ga and N.

17. The method of claim 11, wherein:

epitaxially growing the second III-N material comprises laterally overgrowing the second III-N material above a top surface of the amorphous layer; and epitaxially growing the third III-N material comprises laterally overgrowing substantially undoped GaN from a surface of the second III-N material extending above the top surface of the amorphous layer.

18. A method of fabricating an integrated circuit, the method comprising:

forming a pair n+ doped III-N semiconductor drains over two adjacent substrate regions;

epitaxially growing an n− doped III-N semiconductor drift region from each of the pair of drains, the growing confined to within a trench in an amorphous layer that is over a portion of the drains;

epitaxially growing a pair of III-N semiconductor bodies from a surface of the n− doped III-N semiconductor with growth conditions that expand the III-N semiconductor islands laterally over a top surface of the amorphous layer;

forming a pair of gate electrodes, over a channel portion of the III-N semiconductor bodies; and forming drain contact metallization through the amorphous layer and contacting both of the pair of III-N drains.

19. The method of claim 18, further comprising:

epitaxially growing a III-N polarization layer on each of the III-N semiconductor bodies; and epitaxially growing an n+ doped III-N semiconductor source over each of the III-N bodies on opposite sides of each of gate electrodes.

20. The method of claim 18, further comprising:

depositing the amorphous layer over a substrate;

patterning the trench through the amorphous layer, exposing the substrate;

etching a pair of recesses into the substrate as masked by the amorphous layer; and at least partially backfilling the pair of recesses by epitaxially growing the pair of drains.

* * * * *